(12) United States Patent
Maehashi

(10) Patent No.: US 11,145,243 B2
(45) Date of Patent: Oct. 12, 2021

(54) DIGITAL-ANALOG CONVERSION CIRCUIT, DISPLAY DEVICE, AND ELECTRONIC APPARATUS

(71) Applicant: CANON KABUSHIKI KAISHA, Tokyo (JP)

(72) Inventor: Yu Maehashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/911,138

(22) Filed: Jun. 24, 2020

(65) Prior Publication Data

US 2020/0410922 A1   Dec. 31, 2020

(30) Foreign Application Priority Data

Jun. 28, 2019   (JP) .............................. JP2019-121953

(51) Int. Cl.
  *G09G 3/32*   (2016.01)
  *H03M 1/66*   (2006.01)
(52) U.S. Cl.
  CPC .............. *G09G 3/32* (2013.01); *H03M 1/662* (2013.01); *G09G 2310/027* (2013.01)
(58) Field of Classification Search
  CPC .... G09G 2310/027; G09G 3/32; H03M 1/662
  See application file for complete search history.

(56) References Cited

U.S. PATENT DOCUMENTS

| 2006/0132344 | A1* | 6/2006 | Ishii ........................ | H03M 1/76 341/144 |
| 2006/0214900 | A1  | 9/2006 | Tsuchi | |
| 2007/0237407 | A1* | 10/2007 | Hashido ................. | H03M 1/682 382/233 |
| 2008/0143658 | A1* | 6/2008 | Ishii ...................... | G09G 3/2011 345/87 |
| 2012/0062405 | A1* | 3/2012 | Loeda ...................... | H03M 3/37 341/143 |
| 2012/0235843 | A1  | 9/2012 | Kato | |
| 2015/0162934 | A1* | 6/2015 | Kim ...................... | H03M 1/661 341/110 |

FOREIGN PATENT DOCUMENTS

| JP | 2006-270858 A | 10/2006 |
| JP | 2012-199645 A | 10/2012 |

* cited by examiner

*Primary Examiner* — Muhammad N Edun
(74) *Attorney, Agent, or Firm* — Canon U.S.A., Inc. I.P. Division

(57) ABSTRACT

A digital-analog conversion circuit includes an arithmetic circuit, a voltage output unit, decoders, and output lines. The arithmetic circuit receives a digital signal of multiple bits, divides the multiple bits into groups of two or more bits, and outputs a logical operation result of each group. The voltage output unit outputs voltages having different values. The decoders receive each voltage and the logical operation result, and outputs an analog signal corresponding to the digital signal. The output lines correspond to the decoders. Each decoder includes switches and selection units. The switches correspond to the voltages. Each switch alternates between output, of a corresponding voltage, to a corresponding output line and non-output, of a corresponding voltage, to a corresponding output line. The selection units correspond to the switches. The selection units receive the logical operation result, and each selection unit controls a corresponding switch based on the logical operation result.

13 Claims, 7 Drawing Sheets

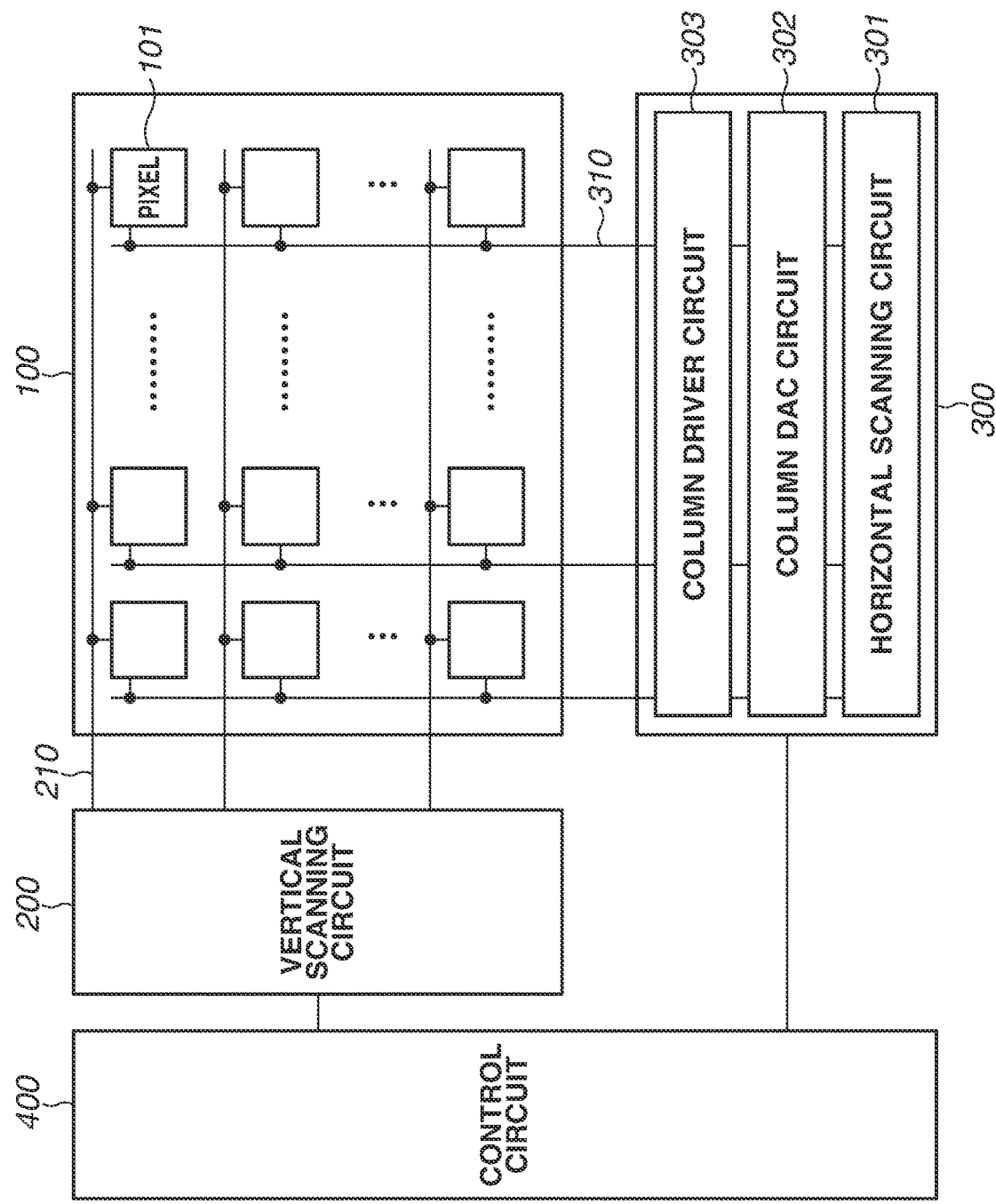

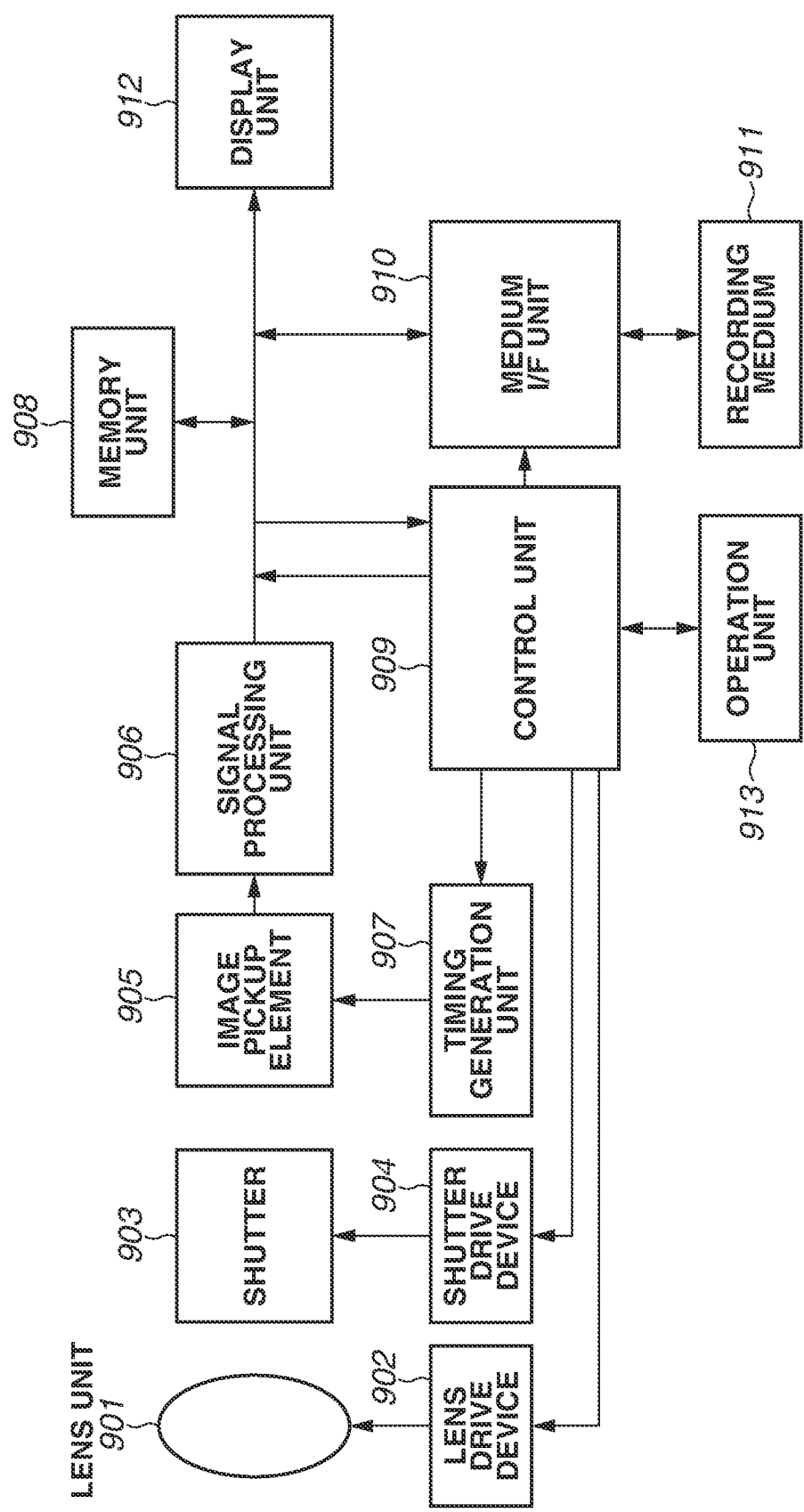

DIGITAL-ANALOG CONVERSION CIRCUIT, DISPLAY DEVICE, AND ELECTRONIC APPARATUS

BACKGROUND

Field of the Invention

The present disclosure relates to a digital-analog conversion circuit that converts a digital signal into an analog signal, a display device including the digital-analog conversion circuit, and an electronic apparatus.

Description of the Related Art

There is known a digital-analog conversion circuit including a digital-analog converter (hereinafter, referred to as DAC) configured to convert an input digital signal into an analog signal.

Various DAC configurations have been proposed, and the DAC configuration discussed in Japanese Patent Application Laid-Open No. 2006-270858 includes a plurality of selection circuits to which voltages different from each other are input. Each of the plurality of selection circuits includes a logic circuit 813A to which a signal of multiple bits is input, and a switch 812A. An ON/OFF operation of the switch 812A is controlled using an output of the logic circuit 813A.

Japanese Patent Application Laid-Open No. 2006-270858 discusses a technique for reducing the circuit area in the DAC, but a technique for reducing the circuit area of the logic circuit 813A configured to control the switch 812A is not sufficiently discussed.

SUMMARY

According to an aspect of the present disclosure, a digital-analog conversion circuit includes an arithmetic operation circuit configured to receive a digital signal of multiple bits, divide the multiple bits into a plurality of groups each including two or more bits, and output a logical operation result of each of the plurality of groups, a voltage output unit configured to output a plurality of voltages having different values, a plurality of decoders configured to receive each of the plurality of voltages and each of the logical operation results, and to output an analog signal corresponding to the received digital signal, and a plurality of output lines provided to respectively correspond to the plurality of decoders, wherein each of the plurality of decoders includes: a plurality of switches provided to respectively correspond to the plurality of voltages, wherein each of the plurality of switches is configured to switch between output, of a corresponding voltage, to a corresponding output line and non-output, of a corresponding voltage, to a corresponding output line, and a plurality of selection units provided to respectively correspond to the plurality of switches, wherein the plurality of selection units is configured to receive the logical operation result, and each of the plurality of selection units is configured to control a corresponding switch based on the logical operation result.

Further features of the present disclosure will become apparent from the following description of exemplary embodiments with reference to the attached drawings.

BRIEF DESCRIPTION OF THE DRAWINGS

FIG. 1 is a schematic diagram illustrating a configuration of a display device.

FIG. 7 is a block diagram illustrating a configuration of an electronic apparatus.

DESCRIPTION OF THE EMBODIMENTS

Figure 2A:
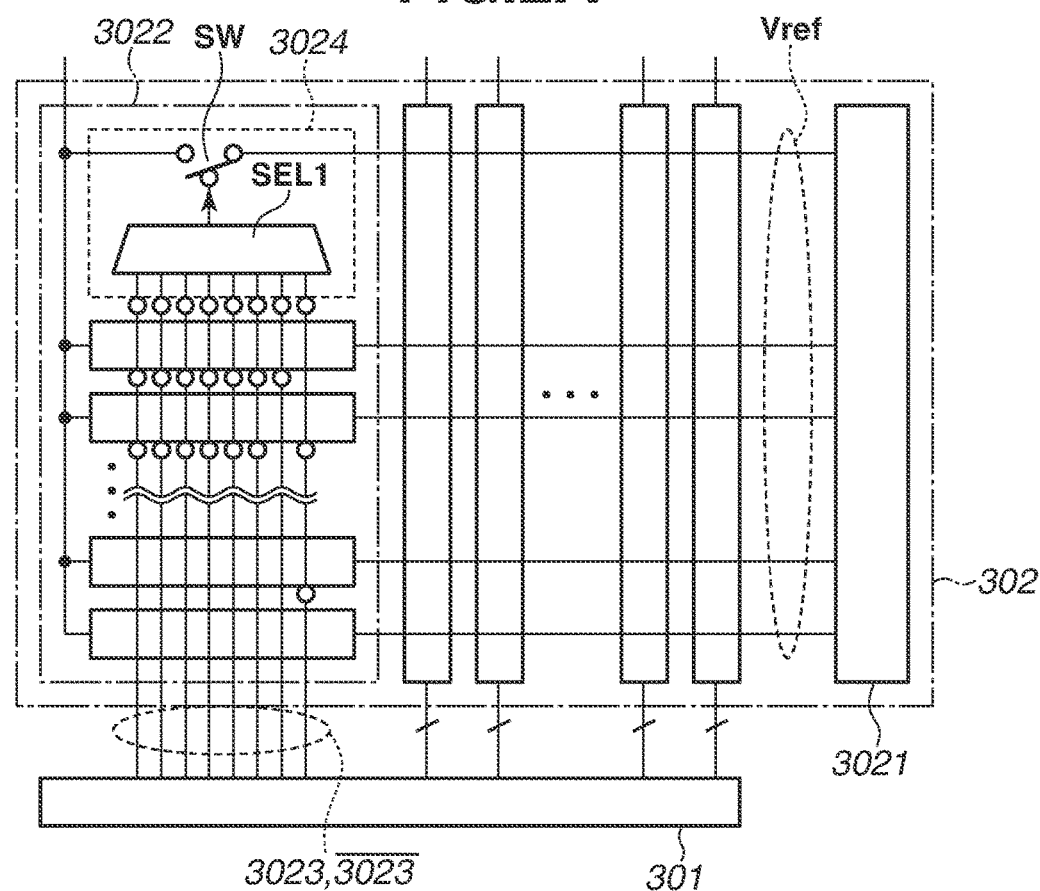
FIGS. 2A and 2B are diagrams illustrating a configuration of a column digital-analog converter (DAC) circuit.

The following exemplary embodiments relate to a technique for reducing the circuit area of each of a plurality of selection units each configured to select a voltage to be output from among a plurality of voltages.

The exemplary embodiments will be described below with reference to the drawings.

In the exemplary embodiments described below, a display device including a digital-analog conversion circuit provided with a digital-analog converter will be mainly described. However, the present disclosure is not limited to the display device, and can be generally applied to a digital-analog conversion circuit configured to convert a digital signal into an analog signal.

FIG. 1 is a schematic diagram illustrating a display device according to a first exemplary embodiment. A pixel array 100 includes a plurality of pixels 101 arranged in a plurality of rows and a plurality of columns (in a two-dimensional form). Each of the pixels 101 receives a control signal from a vertical scanning circuit 200 via a scanning wire 210 and a luminance signal voltage (analog signal) from a signal output circuit 300 via an output line 310. The vertical scanning circuit 200 and the signal output circuit 300 are controlled by a control circuit 400. Each of the pixels 101 includes a light emitting diode (light emitting element) and emits light in a quantity of light emission corresponding to the input luminance signal voltage.

The signal output circuit 300 includes a horizontal scanning circuit 301, a column digital-analog converter (DAC) circuit 302, and a column driver circuit 303. Image data scanned by the horizontal scanning circuit 301 and input to columns is converted into an analog signal voltage by the column DAC circuit 302, and the column driver circuit 303 outputs a luminance signal voltage corresponding to the analog signal voltage.

Figure 2B:
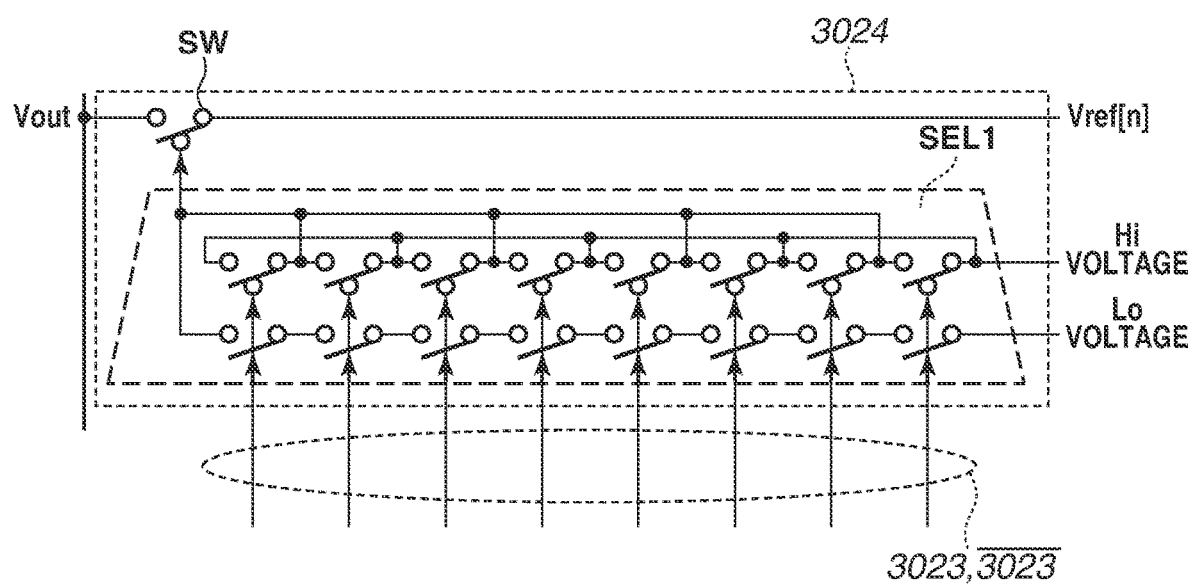

FIGS. 2A and 2B illustrate a configuration of the column DAC circuit 302. The column DAC circuit 302 includes a reference voltage generation unit 3021 (voltage output unit) and a decoder 3022 provided to each of the columns. The reference voltage generation unit 3021 generates $2^m$ reference voltages Vref (where m is a natural number) that are wired commonly to the decoder 3022 for each of the plurality of columns. A connection relationship of the decoder 3022 for each of the columns is switched based on m-bit image data 3023 scanned by the horizontal scanning circuit 301 and input to each of the columns. Accordingly, one corresponding reference voltage Vref among the $2^m$ reference voltages Vref is output to the column driver circuit 303 as an analog signal corresponding to the image data 3023.

An exemplary embodiment will be described with reference to FIGS. 2A and 2B. In FIG. 2A, the decoder 3022 for each of the columns includes $2^m$ unit selection circuits 3024

(circuit blocks). Each of the unit selection circuits 3024 includes a switch SW and a selector SEL1. The switch SW includes two signal terminals and one control terminal. The switch SW switches between output and non-output of the voltage that is input to the signal terminals to the output line 310 based on a signal that is input to the control terminal. One of the signal terminals is connected to one corresponding voltage Vref among the $2^m$ reference voltages Vref, the other of the signal terminals is connected to an output terminal of the decoder 3022 for each of the columns, and the control terminal is connected to the selector SEL1. If a signal is input to the control terminal, the two signal terminals are switched between a conductive state and a non-conductive state depending on the signal level. The selector SEL1 receives the image data 3023 and an inverted signal of the image data 3023, and controls the switch SW to switch to the conductive state if the image data 3023 is desired data and to the non-conductive state if the image data 3023 is data other than the desired data. If the image data 3023 changes and the connection of the decoder 3022 for each of the columns is switched accordingly, only two of switches SW in each of the columns are switched between the conductive state and the non-conductive state (one of the switches SW is switched from the conductive state to the non-conductive state, and the other of the switches SW is switched from the non-conductive state to the conductive state).

In the configuration illustrated in FIG. 2B, the number of switches of the selector SEL1 serving as the selection unit is 16.

The present exemplary embodiment will be described with reference to FIGS. 3A and 3B.

The description of content overlapping with the description given with reference to FIGS. 2A and 2B will be omitted.

Figure 3A:
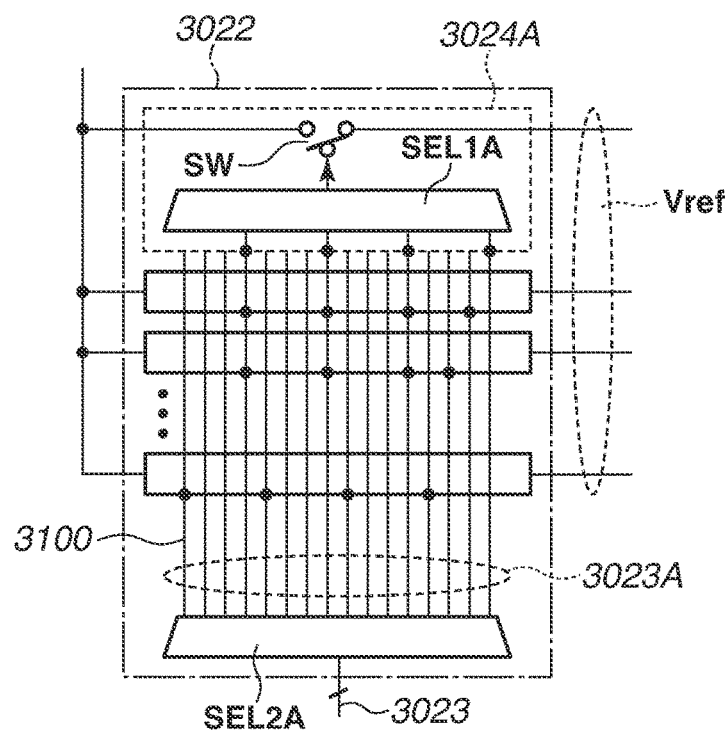
FIGS. 3A and 3B are diagrams illustrating a configuration of the column DAC circuit.
Figure 3B:
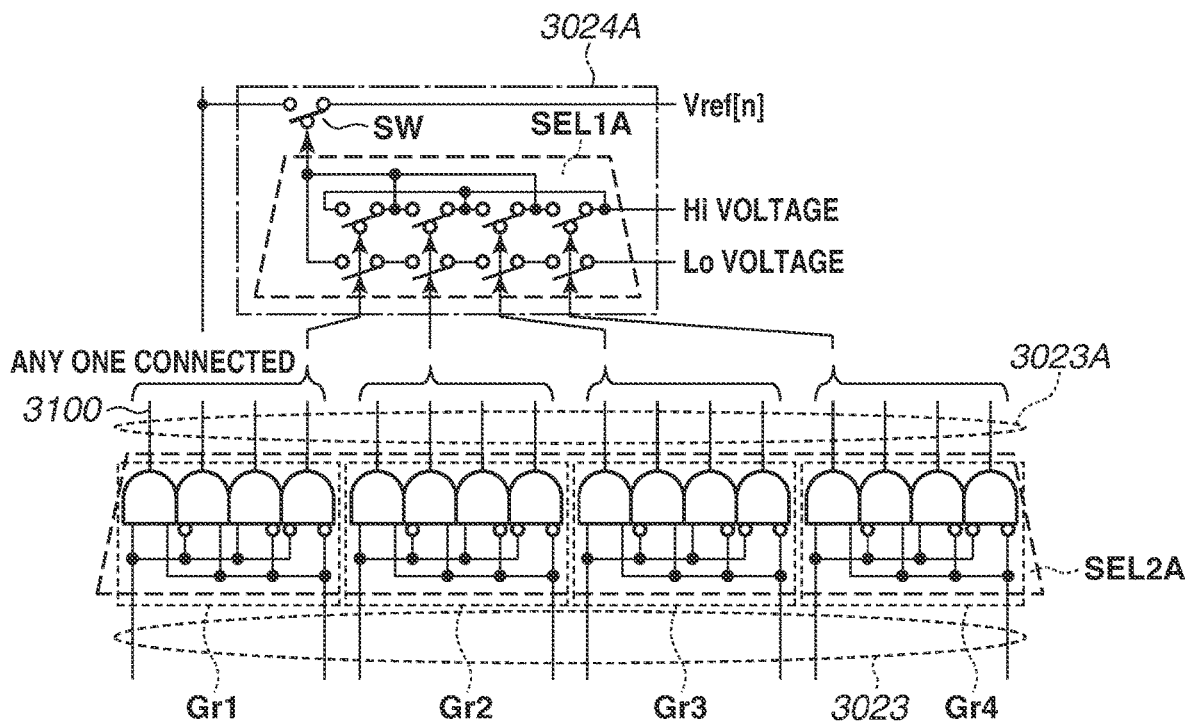

In FIG. 3A, the decoder 3022 for each of the columns includes $2^m$ unit selection circuits 3024A and a second selector SEL2A (arithmetic operation circuit). The second selector SEL2A includes a plurality of groups Gr1 to 4. Each of the plurality of groups Gr1 to 4 receives a 2-bit signal included in the input data. Each of the plurality of groups Gr1 to 4 outputs four signals by performing a logical operation on the input 2-bit signal (two input signals and four output signals). Among the four signals output by each of the plurality of groups Gr1 to 4, only one signal is output as a Hi signal based on signal values of the input 2-bit signal. Here, the signals input to the plurality of groups Gr have two bits, but the signals may have more bits. If a 3-bit signal is input, eight signals are output. More specifically, a relationship between the number of input signals and the number of output signals of each of the plurality of groups Gr is n input signals and $2^m$ output signals.

Each of the unit selection circuits 3024A includes the switch SW and a selector SEL1A. The second selector SEL2A receives the image data 3023 and outputs a signal 3023A for controlling the unit selection circuit 3024A to a corresponding transmission line 3100. Some signals 3023A being a result of logical operation performed on the input data are input to each of a plurality of selectors SEL1A. The plurality of selectors SEL1A is connected so that one signal among the four signals output from each of the plurality of groups Gr1 to 4 is input to the plurality of selectors SEL1A. The plurality of selectors SEL1A controls the corresponding switch SW to switch between the conductive state and the non-conductive state.

In the present exemplary embodiment, the number of switches required for configuring the selector SEL1A can be reduced since the image data 3023 is converted into the signal 3023A by the second selector SEL2A. For example, in a case where image data has eight bits and 256 unit selection circuits 3024 per column are arranged, the number of switches of the selector SEL1 is 16 in FIG. 2B, whereas the number of switches of the selector SEL1A is 8 in FIG. 3B. Thus, in the present exemplary embodiment, it is possible to reduce the number of switches of the selection unit. A plurality of selectors SEL including the selector SEL1 is provided $2^m$ in each of the columns. In the present exemplary embodiment, it is possible to reduce the number of switches of the selectors SEL. Thus, it can be said that the present exemplary embodiment provides a remarkable effect in reducing the circuit area of the column DAC circuit 302.

A level conversion circuit configured to convert the signal level of the signal 3023A may be provided between the second selector SEL2A and the plurality of selectors SEL. The level conversion circuit preferably converts an input Hi signal into a signal having a larger amplitude. On the other hand, the voltage of an input Lo signal is not converted. Thus, a range of voltage output from the level conversion circuit is larger than a range of a voltage input thereto. Thus, it is possible to reduce the voltage handled by a circuit at a preceding stage of the level conversion circuit (e.g., the second selector SEL2A). As a result, withstand voltage performance required for the circuit at the preceding stage of the level conversion circuit can be lowered, and thus, the circuit can be configured by using small elements. Accordingly, it is possible to reduce the circuit area of the digital-analog converter.

Figure 4A:
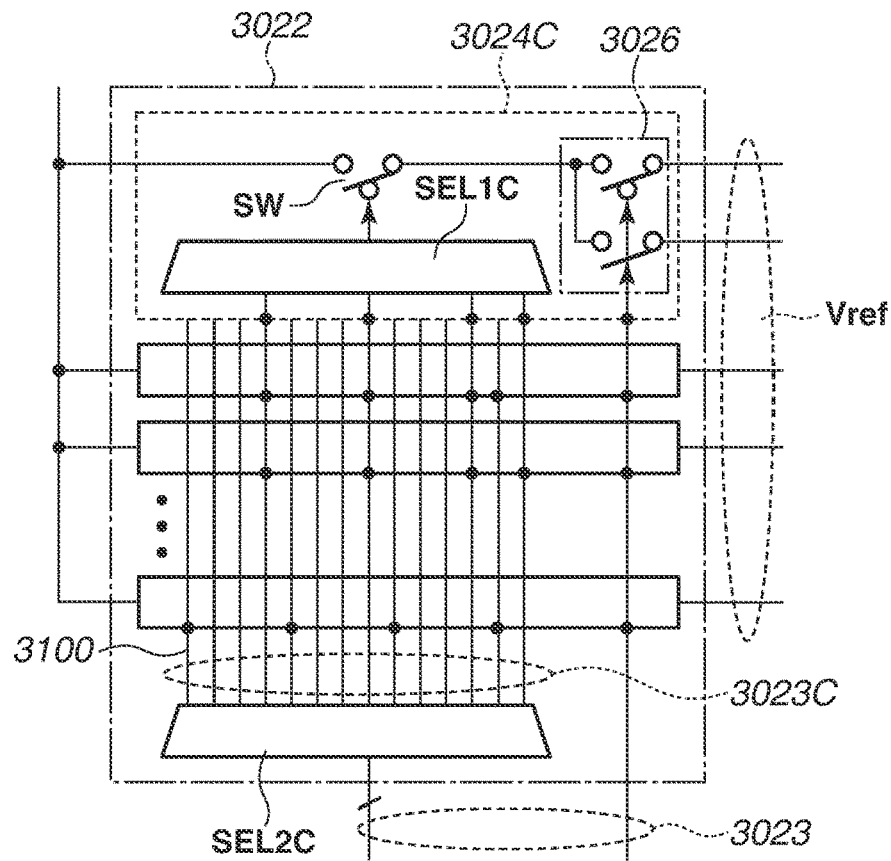
FIGS. 4A and 4B are diagrams illustrating a configuration of the column DAC circuit.
Figure 4B:
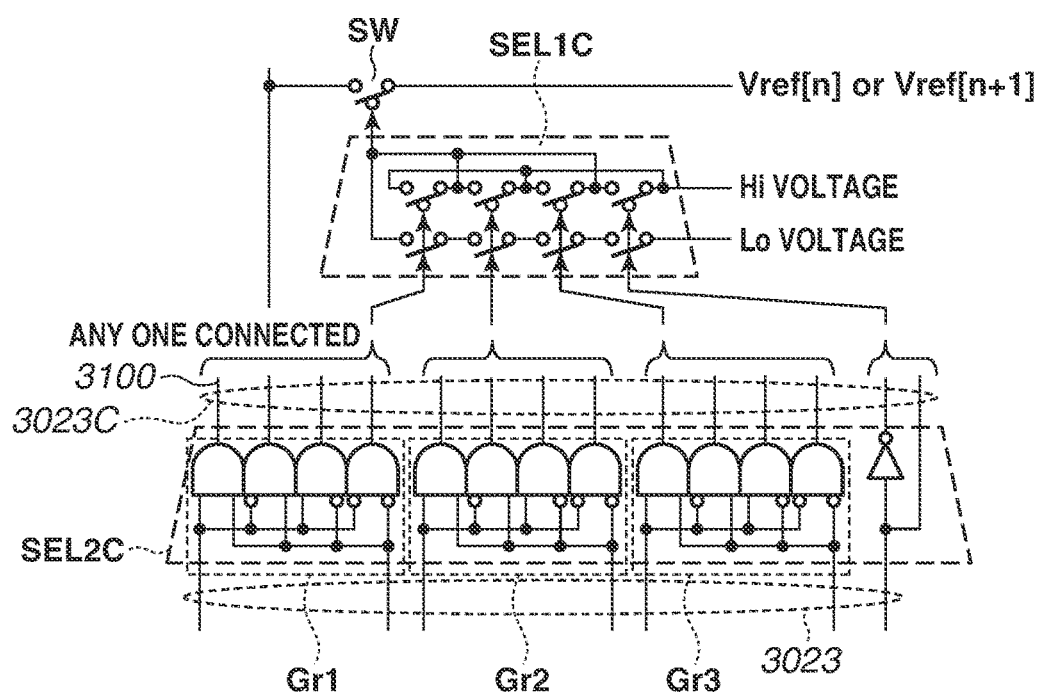

A second exemplary embodiment will be described with reference to FIGS. 4A and 4B. A description of components similar to the first exemplary embodiment will be omitted.

In the present exemplary embodiment, the decoder 3022 for each of the columns includes $2^m/2$ unit selection circuits 3024C and a second selector SEL2C. Each of the unit selection circuits 3024C includes the switch SW, a selector SEL1C, and a 1-bit subDAC 3026. The subDAC 3026 receives two corresponding voltages, which constitute one voltage group, among the $2^m$ reference voltages Vref. Either of the two voltages is output to one end of the signal terminal of the switch SW based on a value of a least significant bit of the image data 3023. The second selector SEL2C receives a signal of a bit other than the least significant bit of the image data 3023 and outputs a signal 3023C for controlling the unit selection circuit 3024C. Some signals 3023C output from the plurality of groups Gr1 to 3 are input to each of a plurality of selectors SEL1C. Each of the plurality of selectors SEL1C controls the corresponding switch SW to switch between the conductive state and the non-conductive state.

In the present exemplary embodiment, the subDAC 3026 is provided, and thus, the number of the unit selection circuits 3024C per column can be reduced to half that of the first exemplary embodiment. Further, the second selector SEL2C is provided, and thus, the number of switches of the first selector SEL1C can be reduced. Thus, it is possible to reduce the circuit area of the column DAC circuit 302.

Figure 5A:
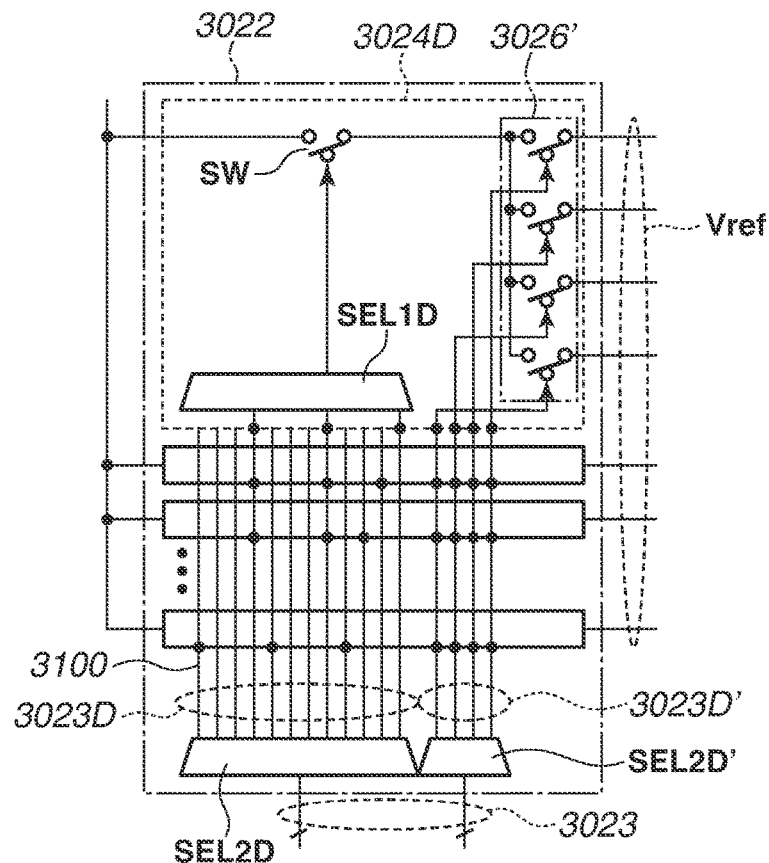
FIGS. 5A and 5B are diagrams illustrating a configuration of the column DAC circuit.
Figure 5B:
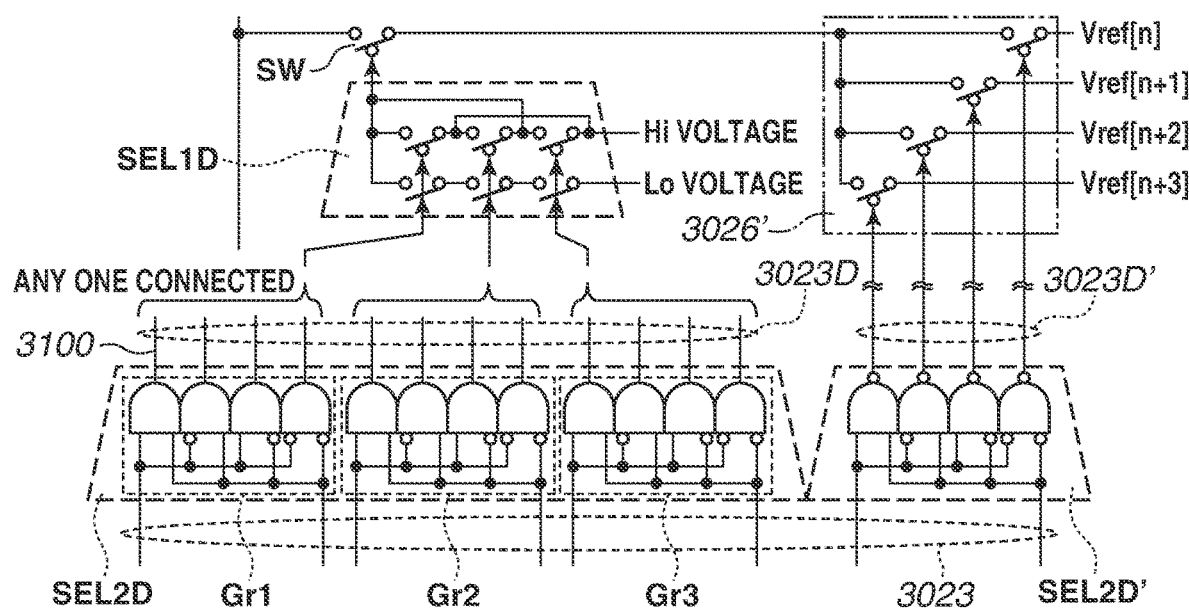

A third exemplary embodiment will be described with reference to FIGS. 5A and 5B. A description of components similar to the second exemplary embodiment will be omitted.

In the present exemplary embodiment, the decoder 3022 for each of the columns includes $2^m/4$ unit selection circuits 3024D and a second selector SEL2D. Further, each of the unit selection circuits 3024D includes the switch SW, a selector SEL1D, and a 2-bit subDAC 3026'. The second selector SEL2D receives a bit other than the lower two bits of the image data 3023, and outputs a signal 3023D for controlling the unit selection circuit 3024D. Each of the plurality of selectors SEL1D receives the signal 3023D and controls the corresponding switch SW to switch between the conductive state and the non-conductive state. The subDAC 3026' receives four corresponding voltages among the $2^m$ reference voltages Vref, and outputs any one of the voltages to one end of the signal terminal of the switch SW. Further, a third selector SEL2D' is provided for each of the columns. The third selector SEL2D' receives the lower two bits of the image data 3023 and outputs a signal 3023D' for controlling a plurality of subDACs 3026'.

In the present exemplary embodiment, the subDAC 3026' has two bits, and thus, the number of the unit selection circuits 3024D per column can be reduced to ¼ with respect to the first exemplary embodiment. Further, the third selector SEL2D' is provided, and thus, the number of switches of the first selector SEL1D can be reduced. Thus, it is possible to reduce the circuit area of the column DAC circuit 302.

Figure 6:
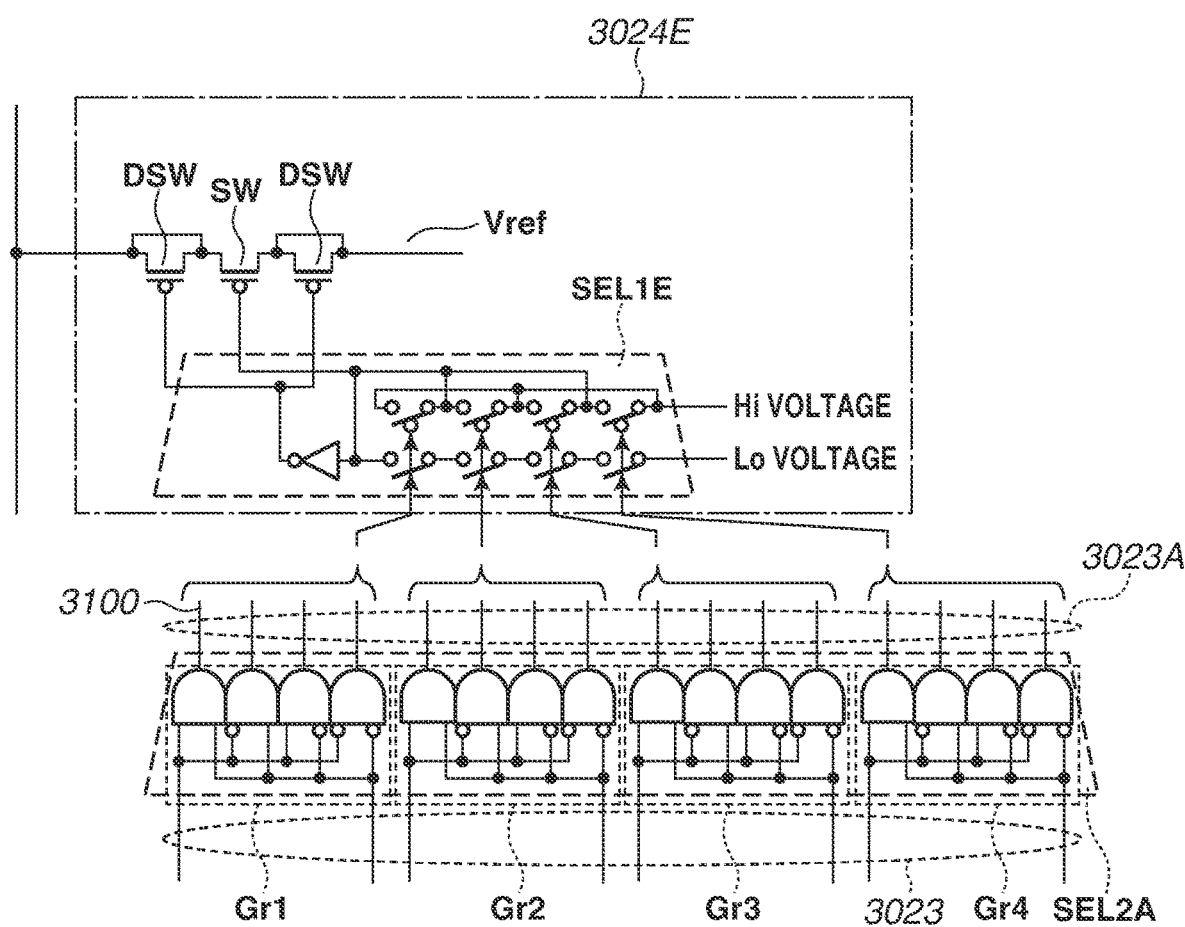
FIG. 6 is a diagram illustrating a configuration of the column DAC circuit.

A fourth exemplary embodiment will be described with reference to FIG. 6. In the present exemplary embodiment, the decoder 3022 for each of the columns includes $2^m$ unit selection circuits 3024E. Each of the unit selection circuits 3024E includes the switch SW, dummy switches DSW each provided to each of the two signal terminals of the switch SW, and a selector SEL1E. In each of the dummy switches DSW, two signal terminals thereof are short-circuited, and a signal having a phase opposite to that of the switch SW is input to a control terminal thereof.

In the present exemplary embodiment, the switch SW and the dummy switches DSW are each configured by using a metal oxide semiconductor field-effect transistor (MOSFET), for example. Further, since signals with the phases opposite to each other are input to the control terminals of the switch SW and the dummy switches DSW, a switching noise generated by the switch SW and a switching noise generated by the dummy switches DSW have opposite phases. More specifically, the switching noises cancel each other, and thus, the apparent noise quantity can be reduced. Therefore, the opposite phases are more preferable from an aspect of linearity of the column DAC circuit 302.

Each of the dummy switches DSW is preferably designed to generate the same amount of noise as the switching noise generated by the switch SW toward each of the signal terminals. For example, in a case where the total amount of switching noise generated by the switch SW is 1 and 0.5 is output to each of the two signal terminals, each of the two dummy switches DSW is designed so that the total amount of generated switching noise is 0.5. As a result, it is possible to reduce the apparent noise quantity.

Exemplary embodiments according to the present disclosure are described above; however, the present disclosure is not limited to these exemplary embodiments. The exemplary embodiments described above can be appropriately changed and combined without departing from the spirit of the present disclosure.

The display device described above can be built in various electronic apparatuses. Examples of such an electronic apparatus include a camera, a computer, a mobile terminal, and an onboard display device. The electronic apparatus may include, for example, a display device and a control unit configured to control drive of the display device.

An exemplary embodiment in which the above-described display device is applied to a display unit of a digital camera will be described with reference to FIG. 7. A lens unit 901 is an imaging optical system that forms an optical image of an object on an image pickup element 905, and includes a focus lens, a magnification varying lens, a diaphragm, and the like. Drive with regard to a focus lens position, a magnification varying lens position, and an aperture diameter of the diaphragm in the lens unit 901 is controlled by a control unit 909 via a lens drive device 902.

A (mechanical) shutter 903 is disposed between the lens unit 901 and the image pickup element 905, and drive of the shutter 903 is controlled by the control unit 909 via a shutter drive device 904. The image pickup element 905 converts an optical image formed in the lens unit 901 by a plurality of pixels into an image signal. A signal processing unit 906 performs analog-to-digital (A/D) conversion, demosaic processing, white balance adjustment processing, and encoding processing on the image signal output from the image pickup element 905.

A timing generation unit 907 outputs various types of timing signals to the image pickup element 905 and the signal processing unit 906. The control unit 909 includes, for example, a memory (a read only memory (ROM), a random access memory (RAM)) and a microprocessor (central processing unit (CPU)), and implements various functions of the digital camera by loading a program stored in the ROM into the RAM and causing the CPU to execute the program to control the components. The functions implemented by the control unit 909 include automatic focus detection (AF) and automatic exposure control (AE).

The control unit 909 and the signal processing unit 906 temporarily store an image signal in a memory unit 908 or use the memory unit 908 as a work area. A medium interface (I/F) unit 910 is an interface for reading from and writing on a recording medium 911 which is, for example, a detachable memory card. A display unit 912 displays a captured image and various types of information about the digital camera. The above-described display device can be applied to the display unit 912. The display device mounted on the digital camera as the display unit 912 is driven by the control unit 909 to display the image and various types of information. An operation unit 913 is a user interface, such as a power switch, a release button, and a menu button, for a user to give an instruction and perform a setting to the digital camera.

An operation of the digital camera capturing an image will be described. If the power is turned on, the digital camera enters an image-capturing standby state. The control unit 909 starts a display process for displaying an image and various types of information on the display unit 912 (display device). If an input of an image-capturing preparation instruction (e.g., half-pressing of the release button of the operation unit 913) is received in the image-capturing standby state, the control unit 909 starts a focus detection process.

The control unit 909 determines a movement amount and a movement direction of the focus lens of the lens unit 901 from an obtained defocus amount and direction, and drives the focus lens via the lens drive device 902 to adjust the focus of the imaging optical system. After driving the focus lens, if necessary, the control unit 909 may further perform focus detection based on a contrast evaluation value to finely adjust the focus lens position.

Then, if an input of an image-capturing start instruction (e.g., fully pressing the release button) is received, the control unit 909 executes an image-capturing operation for recording, processes an obtained image signal in the signal processing unit 906, and stores the processed image signal in the memory unit 908. The control unit 909 records the image signal stored in the memory unit 908 on the recording medium 911 via the medium I/F unit 910. At this time, the control unit 909 may drive the display unit 912 (display device) to display the captured image. Further, the control unit 909 may output the image signal from an external I/F unit (not illustrated) to an external device such as a computer.

According to the exemplary embodiments of the present disclosure, it is possible to reduce the circuit area of each of a plurality of selection units configured to select a voltage to be output from among a plurality of voltages.

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may include one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read-only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-121953, filed Jun. 28, 2019, which is hereby incorporated by reference herein in its entirety.

What is claimed is:

1. A digital-analog conversion circuit comprising:
an arithmetic operation circuit configured to receive a digital signal of multiple bits, divide the multiple bits into a plurality of groups each including two or more bits, and output a logical operation result of each of the plurality of groups;
a voltage output unit configured to output a plurality of voltages having different values;
a plurality of decoders configured to receive each of the plurality of voltages and each of the logical operation results, and to output an analog signal corresponding to the received digital signal; and
a plurality of output lines provided to respectively correspond to the plurality of decoders,
wherein each of the plurality of decoders includes:
a plurality of switches provided to respectively correspond to the plurality of voltages, wherein each of the plurality of switches is configured to switch between output, of a corresponding voltage, to a corresponding output line and non-output, of a corresponding voltage, to a corresponding output line, and
a plurality of selection units provided to respectively correspond to the plurality of switches, wherein the plurality of selection units is configured to receive the logical operation result, and each of the plurality of selection units is configured to control a corresponding switch based on the logical operation result.

2. The digital-analog conversion circuit according to claim 1, further comprising a plurality of circuit blocks,
wherein each of the plurality of circuit blocks is configured to receive a voltage group including plural voltages that are part of the plurality of voltages,
wherein each of the plurality of circuit blocks includes:
a plurality of third switches respectively corresponding to the plural voltages included in the voltage group,
one selection unit among the plurality of selection units, and
one switch among the plurality of switches and corresponding to the one selection unit, and
wherein the one switch is connected to the plurality of third switches and an output line corresponding to the one switch.

3. The digital-analog conversion circuit according to claim 2, further comprising a plurality of transmission lines configured to transmit the logical operation result,
wherein the plurality of transmission lines is provided so that plural transmission lines of the plurality of transmission lines correspond to each group of the plurality of groups.

4. The digital-analog conversion circuit according to claim 3, wherein one transmission line of a one group plurality of transmission lines corresponding to one group of the plurality of groups is connected to the one selection unit of the plurality of selection units, and another transmission line of the one group plurality of transmission lines is connected to another selection unit of the plurality of selection units.

5. The digital-analog conversion circuit according to claim 1, further comprising a plurality of transmission lines configured to transmit the logical operation result,
wherein the plurality of transmission lines is provided so that plural transmission lines of the plurality of transmission lines correspond to each group of the plurality of groups.

6. The digital-analog conversion circuit according to claim 5, wherein one transmission line of a one group plurality of transmission lines corresponding to one group of the plurality of groups is connected to one selection unit of the plurality of selection units, and another transmission line of the one group plurality of transmission lines is connected to another selection unit of the plurality of selection units.

7. The digital-analog conversion circuit according to claim 1, further comprising a plurality of transmission lines configured to transmit the logical operation result,
wherein the plurality of transmission lines is provided so that plural transmission lines of the plurality of transmission lines correspond to each group of the plurality of groups.

8. The digital-analog conversion circuit according to claim 7, wherein one transmission line of a one group plurality of transmission lines corresponding to one group of the plurality of groups is connected to one selection unit of the plurality of selection units, and another transmission line of the one group plurality of transmission lines is connected to another selection unit of the plurality of selection units.

9. A display device comprising
a plurality of pixels arranged in a plurality of rows and a plurality of columns; and
a digital-analog conversion circuit having:
an arithmetic operation circuit configured to receive a digital signal of multiple bits, divide the multiple bits into a plurality of groups each including two or more bits, and output a logical operation result of each of the plurality of groups,
a voltage output unit configured to output a plurality of voltages having different values,
a plurality of decoders configured to receive each of the plurality of voltages and each of the logical operation results, and to output an analog signal corresponding to the received digital signal, wherein the plurality of decoders is provided to respectively correspond to the plurality of columns, and
a plurality of output lines provided to respectively correspond to the plurality of decoders,
wherein each of the plurality of decoders includes:
a plurality of switches provided to respectively correspond to the plurality of voltages, wherein each of the plurality of switches is configured to switch between output, of a corresponding voltage, to a corresponding output line and non-output, of a corresponding voltage, to a corresponding output line, and
a plurality of selection units provided to respectively correspond to the plurality of switches, wherein the plurality of selection units is configured to receive the logical operation result, and each of the plurality of selection units is configured to control a corresponding switch based on the logical operation result.

10. The display device according to claim 9, wherein each of the plurality of pixels includes a light emitting diode emitting light in a quantity of light emission corresponding to the analog signal.

11. The display device according to claim 9, further comprising a plurality of circuit blocks,
wherein each of the plurality of circuit blocks is configured to receive a voltage group including plural voltages that are part of the plurality of voltages,
wherein each of the plurality of circuit blocks includes:
a plurality of third switches respectively corresponding to the plural voltages included in the voltage group,
one selection unit among the plurality of selection units, and
one switch among the plurality of switches and corresponding to the one selection unit, and
wherein the one switch is connected to the plurality of third switches and an output line corresponding to the one switch.

12. An electronic apparatus comprising:
a display device; and
a control unit configured to control drive of the display device,
wherein the display device includes:
a plurality of pixels arranged in a plurality of rows and a plurality of columns, wherein each of the plurality of pixels includes a light emitting diode emitting light in a quantity of light emission corresponding to an analog signal, and
a digital-analog conversion circuit having:
an arithmetic operation circuit configured to receive a digital signal of multiple bits, divide the multiple bits into a plurality of groups each including two or more bits, and output a logical operation result of each of the plurality of groups,
a voltage output unit configured to output a plurality of voltages having different values,
a plurality of decoders configured to receive each of the plurality of voltages and each of the logical operation results, and to output the analog signal corresponding to the received digital signal, wherein the plurality of decoders is provided to respectively correspond to the plurality of columns, and
a plurality of output lines provided to respectively correspond to the plurality of decoders,
wherein each of the plurality of decoders includes:
a plurality of switches provided to respectively correspond to the plurality of voltages, wherein each of the plurality of switches is configured to switch between output, of a corresponding voltage, to a corresponding output line and non-output, of a corresponding voltage, to a corresponding output line, and
a plurality of selection units provided to respectively correspond to the plurality of switches, wherein the plurality of selection units is configured to receive the logical operation result, and each of the plurality of selection units is configured to control a corresponding switch based on the logical operation result.

13. The electronic apparatus according to claim 12, further comprising a plurality of circuit blocks,
wherein each of the plurality of circuit blocks is configured to receive a voltage group including plural voltages that are part of the plurality of voltages,
wherein each of the plurality of circuit blocks includes:
a plurality of third switches respectively corresponding to the plural voltages included in the voltage group,
one selection unit among the plurality of selection units, and
one switch among the plurality of switches and corresponding to the one selection unit, and
wherein the one switch is connected to the plurality of third switches and an output line corresponding to the one switch.

* * * * *